United States Patent [19]
Bryant et al.

[11] Patent Number: 5,750,247
[45] Date of Patent: May 12, 1998

[54] COATED CUTTING TOOL HAVING AN OUTER LAYER OF TIC

[75] Inventors: William A. Bryant, McKeesport; A. T. Santhanam, Monroeville, both of Pa.

[73] Assignee: Kennametal, Inc., Latrobe, Pa.

[21] Appl. No.: 616,800

[22] Filed: Mar. 15, 1996

[51] Int. Cl.$^6$ ............................................. B23B 27/14
[52] U.S. Cl. ............................ 428/323; 51/295; 51/307; 51/309; 428/457; 428/469; 428/472; 428/336; 428/697; 428/698; 428/699; 75/240; 407/119; 427/255; 427/255.2
[58] Field of Search .................... 428/457, 469, 428/472, 323, 336, 697, 698, 699; 51/295, 307, 309; 407/119; 75/240; 427/255, 255.2

[56] References Cited

U.S. PATENT DOCUMENTS

| | | | |
|---|---|---|---|
| 3,640,689 | 2/1972 | Glaski et al. | 29/195 |
| 3,755,866 | 9/1973 | Ohlsson | 29/95 |
| 4,028,142 | 6/1977 | Bitzer et al. | 148/16.5 |
| 4,150,195 | 4/1979 | Tobioka et al. | 428/548 |
| 4,196,233 | 4/1980 | Bitzer et al. | 427/249 |
| 4,268,569 | 5/1981 | Hale | 428/215 |
| 4,448,802 | 5/1984 | Buhl et al. | 427/42 |
| 4,497,874 | 2/1985 | Hale | 428/551 |
| 4,610,931 | 9/1986 | Nemeth et al. | 428/547 |
| 4,640,869 | 2/1987 | Loth | 428/469 |
| 4,686,156 | 8/1987 | Baldoni, II et al. | 428/698 |
| 4,720,437 | 1/1988 | Chudo et al. | 428/698 |
| 4,902,395 | 2/1990 | Yoshimura | 204/192.3 |
| 5,093,151 | 3/1992 | van den Berg et al. | 427/39 |
| 5,106,674 | 4/1992 | Okada | 51/307 |
| 5,188,489 | 2/1993 | Santhanam et al. | 407/119 |
| 5,235,879 | 8/1993 | Drougge | 51/309 |
| 5,250,367 | 10/1993 | Santhanam et al. | 428/698 |
| 5,266,388 | 11/1993 | Santhanam et al. | 428/212 |
| 5,272,014 | 12/1993 | Leyendecker et al. | 428/457 |
| 5,364,209 | 11/1994 | Santhanam et al. | 407/119 |

FOREIGN PATENT DOCUMENTS

| | | |
|---|---|---|
| 52141183 | 7/1979 | Japan . |
| 56-77819 | 11/1982 | Japan . |
| 59-18474 | 4/1984 | Japan . |
| 58133791 | 2/1985 | Japan . |
| 60197401 | 3/1987 | Japan . |
| 35281988 | 7/1989 | Japan . |
| 1601224 | 10/1981 | United Kingdom . |

OTHER PUBLICATIONS

Schuhmacher, "TiC Coated Hardmetals", Technische Mitteilungen, vol. 64, 1971. (English Translation).

Archer, The Plasma–Assisted Chemical Vapor Deposition of TiC, TiN and $TiC_xN_{1-x}$ Thin Solid Films 8D (1981) 221–225.

Santhanam et al., "Cemented Carbides", Metals Handbook, vol. 16, 9th Ed.

Rieter, "Hard Metal Cutting Materials—sate of the Art and Prospects", VDI-Z 122 (1980), No. 13—Jul., pp. 155–159. (English Translation).

*Primary Examiner*—Archene Turner
*Attorney, Agent, or Firm*—Stanislav Antolin

[57] ABSTRACT

A coated cutting tool, as well as a method for making tool and a method for the milling of ductile iron using the cutting tool wherein the cutting tool includes a rake face and a flank face with a cutting edge at the juncture there. The cutting tool also presents a coating and a substrate. The substrate comprises a tungsten carbide based cemented carbide having a bulk composition of no more than 7 weight percent tantalum, no more than 3 weight percent niobium, no more than 5 weight percent titanium, no more than 1 weight percent chromium, between about 5 and about 13 weight percent cobalt, and the balance tungsten carbide. The coating has an innermost coating scheme including at least one layer adjacent to the substrate, and an outermost layer comprising titanium carbide applied by chemical vapor deposition layer.

46 Claims, 2 Drawing Sheets

COATED CUTTING TOOL HAVING AN OUTER LAYER OF TIC

BACKGROUND OF THE INVENTION

The invention pertains to an improved coated cutting tool used for milling, as well as a method of making the cutting tool and a method of milling using the cutting tool. More specifically, the invention pertains to an improved coated cutting tool, as well as a method of making the cutting tool and a method of milling ductile iron alloys using the cutting tool, wherein the tool has an outer layer of titanium carbide applied thereto by chemical vapor deposition (CVD).

Among the various metalcutting processes, milling places the most demands on the cutting tool. Milling involves interrupted chip removal at constant speed. The cutting tool tip repeatedly enters, cuts, and then leaves the workpiece so as to sustain mechanical shock as well as thermal shock with the attendant variations in the stress field.

The magnitude of these shocks depends upon the length of the cut and the interval between cuts. The entry and exit parameters can also determine the extent to which the cutting tool is subjected to mechanical shock. Even at lower speeds such as, for example, less than about 1.78 surface meters per second (about 350 surface feet per minute (sfm)) the mechanical shock is meaningful.

The mechanical shock and especially the thermal shock are aggravated with an increase in the cutting speed. Thus, high speed milling at speeds between about 3.05 surface meters per second (about 600 surface feet per minute (sfm)) and about 4.06 surface meters per second (about 800 surface feet per minute (sfm)) aggravates the mechanical and thermal shock on the cutting tool.

It is typical that the mechanical shock and the thermal shock are localized within a small volume of material near the cutting edge of the cutting tool. The extreme mechanical and thermal shocks imposed upon this small volume of material results in the phenomenon of thermo-mechanical intermittent stress application. Thermo-mechanical intermittent stress application generates cracks in the substrate and the coating.

Referring to the mechanical shock and the thermal shock individually, the intermittent mechanical shock results in the formation (or generation) of cracks in the substrate. The thermal shock results in the formation of cracks in the coating. Cracks in the substrate can lead to the complete failure of the cutting tool while cracks in the coating can lead to a shortening of the useful life of the cutting tool. High speed milling aggravates the formation of cracks in the substrate and in the coating.

In addition to the individual effect of thermal and mechanical shock, thermal shock and mechanical shock function together. In this regard, repeated thermal shocks causes the cracks in the coating to propagate into the substrate. The link-up of the mechanical shock-generated cracks and the thermal shock-generated cracks at or near the surface of the substrate provides the basis for the wear mode known as micro-chipping. The existence of micro-chipping shortens the useful life of a cutting tool.

It would be desirable to provide a coated cutting tool that better withstands the mechanical shock inherent with a milling operation, especially a high speed milling operation, than do the present cutting tools. It would also be desirable to provide a coated cutting tool that better withstands the thermal shock inherent with a milling operation, especially a high speed milling operation, than do the present cutting tools.

In the past, there have been cutting tools with a single coating of TiC. In this regard, the Santhanam et al. article ("Cemented Carbides", *Metals Handbook*, Vol. 16, 9th Edition, Machining, (1989), ASM International, Metals Park, Ohio, pp. 71–89) generally imentions at page 80 the use of a single TiC coating applied by a chemical vapor deposition (CVD) process.

Other articles mention the use of a titanium carbide coating for a cutting tool, but not necessarily as the outermost layer. These articles are silent about the nature of the process for applying the titanium carbide coating. A brief description of these articles is set forth hereinafter.

The article by Schumacher ("TiC Coated Hardmetals", *Technische Mitteilungen*, Vol. 64, No. ½ (1971)) discloses a WC—Co(9%) substrate coated with TiC, but there is no indication of the nature of the coating process. FIG. 4 of Schumacher shows a sample with a WC—Co(6%) substrate and a fine-grained TiC coating, which according to Schumacher has good wear resistance, high-temperature wear resistance, reduced adhesive tendency, and higher chemical resistance. Schumacher discloses that coated inserts of TT10, TT15, TT25 show improvement for machining ferrous materials. Schumacher also mentions that TiC coated inserts are good for the face milling of gray cast iron.

The article by Rieter ("Hard Metal Cutting Materials— State of the Art and Prospects", *VDI-Z*, 122, No. 13 (1980), pp. 155–159) mentions the desirability of using a fine-grained cemented tungsten carbide substrate with low binder alloy content. Such a material has high hardness, compressive strength and wear resistance. Rieter also mentions that TiC coated substrates have a wide application. Table 4 of Rieter discloses the use of a TiC coating for substrates of the ISO classifications of M15, P25, P40 and K10. Rieter is silent as to whether the coating process is CVD or PVD. Table 4 of the Rieter article also shows combinations of TiC along with TiN and Ti (C,N). Rieter mentions that the coated cutting tools have turning of cast iron as a main field of application.

There are some patent documents that mention the use of a titanium carbide coating for use with a cutting tool. In this regard, U.S. Pat. No. 4,150,195 to Tobioka et al. discloses the CVD application of a single layer of TiC over a WC—Co substrate. For instance, Example No. 1 concerns a P30 substrate that has a 5 μm thick layer of TiC deposited thereon by CVD.

U.S. Pat. No. 3,640,689 to Glaski et al. teaches the CVD application of a TiC layer to a barrier layer that overlies the substrate. The Glaski et al. patent mentions that the barrier material is limited due to the temperatures of the processing. Glaski et al. suggests that titanium nitride may be a barrier layer (see Column 3, lines 54–71), which is shown in Example 7 (Column 8, lines 59–75).

U.S. Pat. No. 4,686,156 to Baldoni, II et al. shows a cutting tool with a WC—Co substrate (5 to 30% binder) that has an outer TiC layer which overlies a base layer of TiN or TiCN, which in turn, overlies a TiC layer. The TiC appears to be applied via CVD techniques. Table I of Baldoni, II et al. shows a TiC/TiN/TiC scheme.

Other patent documents include U.S. Pat. No. 3,755,866 to Ohlsson for an INSERT FOR CUTTING OR STEEL, CAST IRON OR SIMILAR MATERIAL shows a cemented carbide substrate with two layers thereon. The inner layer is selected from titanium carbide, tantalum carbide, vanadium carbide, zirconium carbide, hafnium carbide and niobium carbide. The outer layer is selected from tungsten carbide, molybdenum carbide, and chromium carbide.

U.S. Pat. No. 4,268,569 to Hale for COATING UNDERLAYERS shows a variety of underlayers for a coated cutting tool in which the outer layer is either hafnium carbonitride and/or zirconium carbonitride.

U.S. Pat. No. 4,497,874 to Hale for a COATED CARBIDE CUTTING TOOL INSERT shows the deposition of multiple layers on a substrate in which the outermost layer is either titanium nitride or alumina. The substrate presents binder enrichment at the surface thereof.

U.S. Pat. No. 4,640,869 to Loth for a HARD METAL WATCH CASE WITH RESISTANT COATING shows the deposition of a multi-layer coating arrangement for a watch case. The first coating is titanium nitride applied via CVD. The second coating is titanium nitride applied via PVD (physical vapor deposition).

U.S. Pat. No. 4,720,437 to Chudo et al. for a SURFACE-COATED CEMENTED CARBIDE ARTICLE OR PART shows the use of an inner layer of titanium carbide along with an outer layer of titanium carbide. This patent also shows the use of an intermediate coating arrangement of either a single layer of titanium nitride or a composite in which there is a layer of titanium nitride sandwiched in between layers of titanium carbonitride.

U.S. Pat. No. 4,828,612 to Yohe for SURFACE MODIFIED CEMENTED CARBIDES shows the deposition of coatings on a substrate with binder enrichment near the surface due to the depletion of aluminum nitride.

U.S. Pat. No. 4,902,395 to Yoshimura shows a coated cutting tool in which the substrate is a titanium carbonitride-based cermet. The examples show an outer layer of titanium carbide with an inner layer of titanium nitride. Both the inner and outer layers are applied by physical vapor deposition (ion plating).

Japanese Kokai No. 54-73,392 for A COATED TIP FOR MILLING CUTTERS shows the use of a coating of the carbides or carbonitrides of titanium, hafnium or zirconium in conjunction with a milling cutting insert. Example No. 1 shows the deposition of a 3 micrometer thick layer of titanium carbide on the substrate and a 1 micrometer thick layer of titanium carbide on the first titanium carbide layer. Example No. 2 shows the deposition of a base layer of titanium carbide, an intermediate layer of titanium carbonitride, and an outer layer of titanium nitride. Example No. 3 provides a number of specimens with a base layer of titanium carbide, an intermediate layer of titanium carbonitride, and an outer layer of titanium nitride. This patent also mentions that it is preferable for the substrate to contain free carbon.

Japanese Kokai No. 57-192,260 for a COATED SINTERED HARD ALLOY TOOL shows a coated cutting tool in which the inner layer is selected from silicon nitride, a SiAlON or silicon carbide. The outer layer is selected from titanium carbide, titanium carbonitride or titanium carbide.

Japanese Sho 59-18474 for a COATED HARDMETAL CUTTING INSERT shows a coated cutting tool with a single layer of titanium carbide (Example No. 1) or titanium nitride (Example No. 2).

Japanese Kokai No. 60-25,605 for a COATED CERMET TIP FOR A CUTTING TOOL shows the deposition of a coating scheme on a substrate that has a softened layer near the surface.

Japanese Kokai No. 62-56564 for a SURFACE COATED HARD ELEMENT WITH GOOD WEAR RESISTANCE shows in the examples thereof the use of a (Ti, Zr)C or (Ti, Zr)CN or (Ti, Zr)N in the coating scheme comprising one or more layers. It appears that these coatings are applied by physical vapor deposition.

Japanese Pat. Application No. 3528/88 for a THROW-AWAY MILLING TOOL TIP COMPRISING A TUNGSTEN ULTRA-HARD ALLOY WITH SURFACE COATING shows various examples in which titanium carbide is an inner layer. The outermost layers appear to be either titanium nitride, titanium carbonitride, alumina or molybdenum oxide.

U.K. Pat. No. 1,601,224 for a COATED HARD METAL BODY shows the deposition of a coating of titanium nitride or titanium carbonitride on a layer of titanium carbide.

SUMMARY OF THE INVENTION

It is an object of the invention to provide an improved coated cutting tool for the milling of ductile iron alloys.

It is another object of the invention to provide an improved coated cutting tool for the milling of ductile iron alloys wherein the cutting tool has improved mechanical shock resistance.

It is still another object of the invention to provide an improved coated cutting tool for the milling of ductile iron alloys wherein the cutting tool has improved thermal shock resistance.

In one form thereof, the invention is a coated cutting tool for the milling of ductile iron wherein the cutting tool comprises a rake face, a flank face, and a cutting edge at the a juncture of the rake face and the flank face. The cutting tool has a coating and a substrate. The substrate comprises a tungsten carbide based cemented carbide with a bulk composition of no more than 7 weight percent tantalum, no more than 3 weight percent niobium, no more than 5 weight percent titanium, no more than 1 weight percent chromium, between about 5 and about 13 weight percent cobalt, and the balance tungsten carbide. The coating has an innermost coating scheme which includes at least one layer adjacent to the substrate. The coating further includes an outermost layer comprising titanium carbide applied by chemical vapor deposition layer.

In another form thereof, the invention is a method of making a coated cutting tool comprising the steps of: providing a substrate that is a tungsten carbide based cemented carbide having a bulk composition of no more than 7 weight percent tantalum, no more than 3 weight percent niobium, no more than 5 weight percent titanium, no more than 1 weight percent chromium, between about 5 and about 13 weight percent cobalt, and the balance tungsten carbide; applying an innermost coating scheme to the substrate; and applying by chemical vapor deposition an outermost layer of titanium carbide to the inner coating scheme.

In still another form thereof, the invention is a method of milling ductile iron comprising the steps of: milling the ductile iron at a predetermined speed with a cemented carbide cutting tool having a substrate and a coating. The substrate comprises a tungsten carbide based cemented carbide having a bulk composition of no more than 7 weight percent tantalum, no more than 3 weight percent niobium, no more than 5 weight percent titanium, no more than 1 weight percent chromium, between about 5 and about 13 weight percent cobalt, and the balance tungsten carbide. The coating comprises an innermost coating scheme including at least one layer adjacent to the substrate, and the coating further including an outermost coating comprising a layer of titanium carbide applied by chemical vapor deposition.

BRIEF DESCRIPTION OF THE DRAWINGS

The following is a brief description of the drawings which form a part of this patent application.

DETAILED DESCRIPTION OF A SPECIFIC EMBODIMENT

Figure 1:
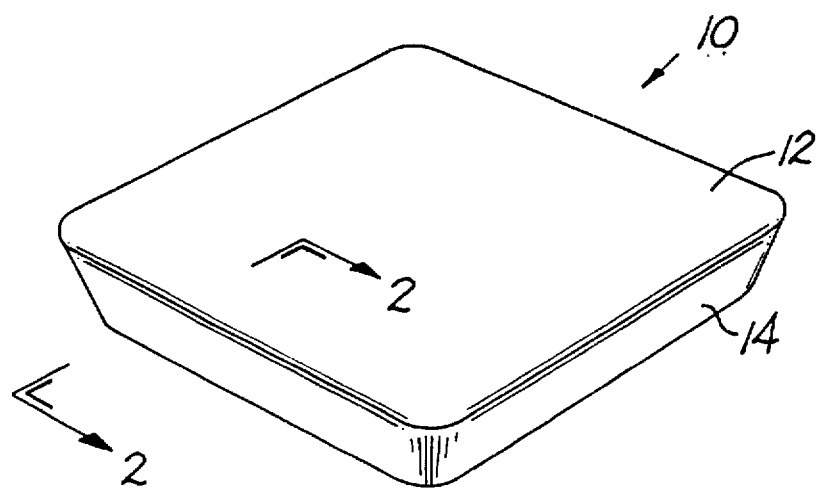
FIG. 1 is a perspective view of a specific embodiment of the cutting tool of the invention.
Figure 2:
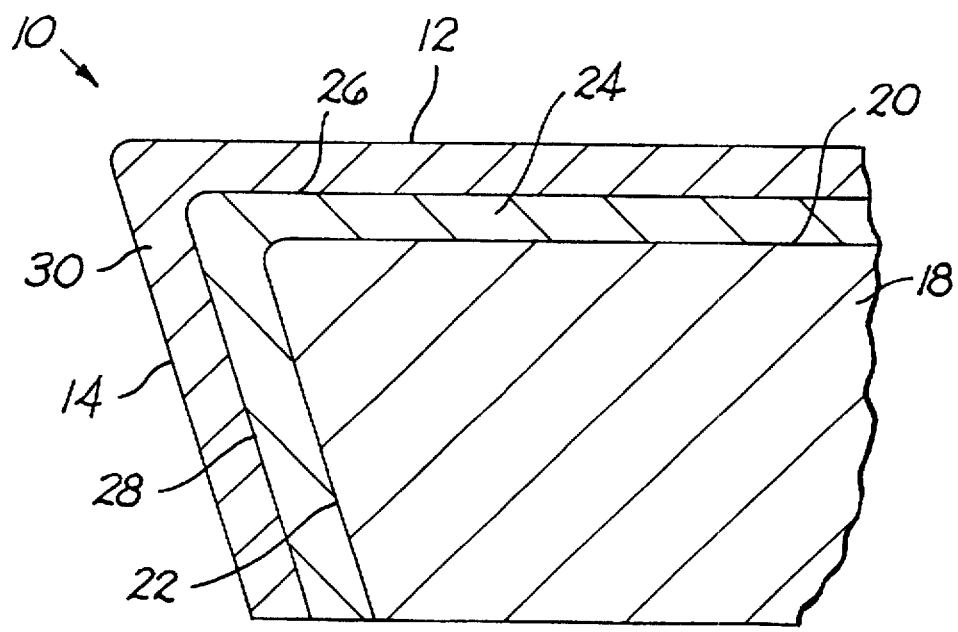
FIG. 2 is a cross-sectional view of a portion of the cutting tool of FIG. 1 taken along section line 2—2 so as to illustrate the coating scheme wherein there is a single innermost coating layer and a single outermost coating layer.

Referring to the drawings, FIGS. 1 and 2 illustrate a first specific embodiment of the cutting tool invention generally designated as 10. Cutting tool 10 has a rake surface 12 and a flank surface 14.

Cutting tool 10 also has a substrate 18. Substrate 18 has a rake surface 20 and a flank surface 22. An innermost coating 24 is deposited directly upon the rake and flank surfaces (20 and 22) of the cutting tool substrate 18. Innermost coating 24 may comprise any one of a number of various coating layers. The thickness of the innermost layer 24 is between about 2 micrometers (μm) and about 4 micrometers (μm).

One example of the innermost coating 24 is a titanium carbonitride layer applied by conventional chemical vapor deposition techniques at a temperature of between about 900° C. and about 1050° C.

Another example of the innermost coating 24 is a titanium carbonitride layer applied by chemical vapor deposition techniques which occur at temperatures lower than those of the conventional CVD processes. For example, the plasma assisted chemical vapor deposition (PACVD) process operates at temperatures between about 300° C. and about 800° C. In this regard, the article by Archer entitled "The Plasma-Assisted-Chemical Vapour Deposition of TiC, TiN and $TiC_xN_{1-x}$", Thin Solid Films, Vol. 80, (1981), pp. 221-225 discusses the deposition of a titanium carbonitride layer at a temperature of 300° C. U.S. Pat. No. 5,093,151 to van den Berg et al. for a PLASMA CVD PROCESS FOR COATING A BASIC TOOL BODY discusses the plasma-activated CVD process for applying a layer of titanium carbonitride at temperature ranges between about 400° C. and about 800° C. Another example, the moderate temperature chemical vapor deposition (MTCVD) process operates at temperatures between about 500° C. and about 850° C. In this regard, U.S. Pat. No. 4,028,142 to Bitzer et al. for CARBO-NITRIDING PROCESS USING NITRILES and U.S. Pat. No. 4,196,233 to Bitzer et al. for a PROCESS FOR COATING INORGANIC SUBSTRATES WITH CARBIDES, NITRIDES AND/OR CARBONITRIDES each discuss a CVD process at a temperature as low as 500° C. The process of the '142 patent uses certain nitriles in conjunction with other substances to produce diffusion layers of carbides, nitrides and/or carbonitrides. The temperature ranges between 500° C. and 1800° C. and the pressure ranges between 700 to 800 mm Hg. The '233 patent shows a process that also uses nitriles along with other substances to produce coatings of carbides, nitrides and/or carbonitrides at a temperature range of between 500° C. and 1800° C.

By performing the CVD process at the lower temperature range (e.g., between 300° C. and 800° C.), the chance that eta phase will form is reduced as compared to the conventional CVD process.

Still another example of the innermost coating 24 is a titanium aluminum nitride layer applied by physical vapor deposition. In this regard, U.S. Pat. No. 5,272,014 to Leyendecker et al. for a WEAR-RESISTANT COATING FOR SUBSTRATE AND METHOD FOR APPLYING discusses the application of a titanium aluminum nitride layer via PVD techniques.

Cutting tool 10 further includes an outermost layer 30 applied by chemical vapor deposition directly to the rake and flank surfaces (26 and 28) of the innermost coating 24. Outermost coating layer is titanium carbide. The thickness of the outermost layer 30 is about 1.5 micrometers.

Figure 3:
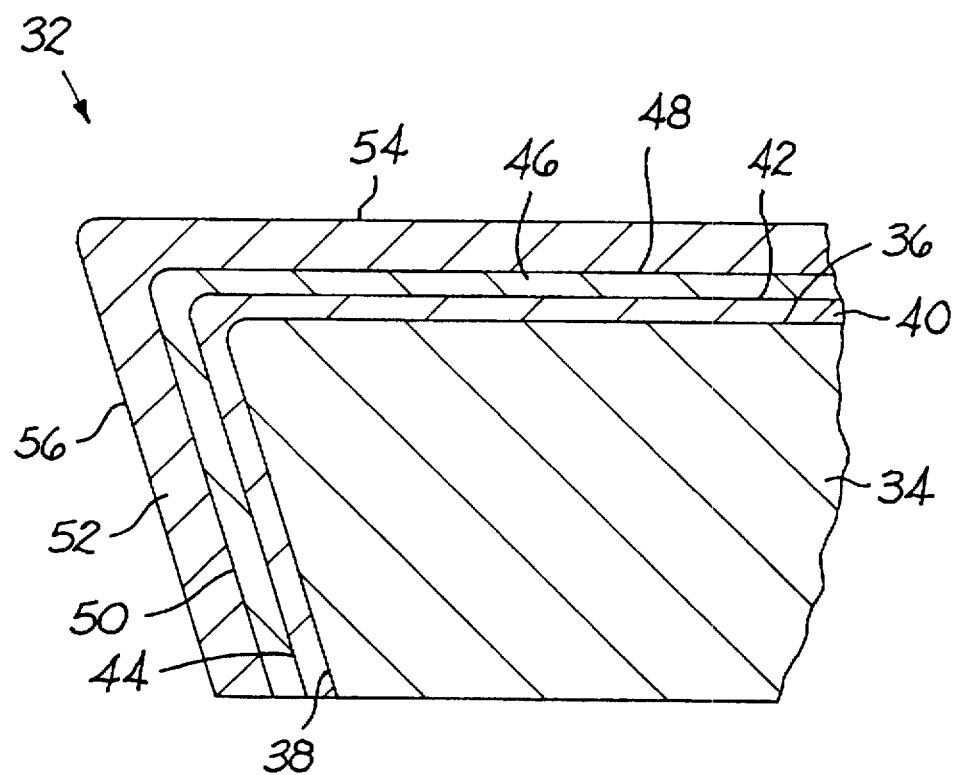
FIG. 3 is a cross-sectional view of another specific embodiment of the invention so as to illustrate the coating scheme wherein there is an inner coating layer, an intermediate coating layer, and a single outermost coating layer.

FIG. 3 illustrates the cross-sectional view of a second specific embodiment of the cutting tool of the invention, generally designated as 32. Cutting tool 32 has a rake surface 54 and a flank surface 56.

Cutting tool 32 also has a substrate 34. Substrate 34 has a rake surface 36 and a flank surface 38. An innermost coating 40 is deposited directly upon the rake and flank surfaces (36 and 38) of the cutting tool substrate 34.

Innermost coating 40 comprises titanium nitride applied by physical vapor deposition. U.S. Pat. No. 4,448,802 to Behl et al. for a METHOD AND APPARATUS FOR EVAPORATING MATERIAL UNDER VACUUM USING BOTH AN ARC DISCHARGE AND ELECTRON BEAM mentions the PVD application of a titanium nitride layer.

An intermediate coating 46 of titanium carbonitride is applied directly to the rake and flank surfaces (42 and 44) of the innermost coating 40 by physical vapor deposition. The combined thickness of the inner layer 40 and the intermediate layer 46 is between about 2 micrometers and about 4 micrometers.

Cutting tool 32 further includes an outermost layer 52 applied by chemical vapor deposition directly to the rake and flank surfaces (48 and 50) of the intermediate coating 46. The outermost coating is titanium carbide. The thickness of the outermost layer 52 is about 1.5 micrometers.

The substrates (18 and 34) for both specific embodiments of the cutting tools (10 and 32, respectively) are cemented tungsten carbide-based compositions wherein the binder metal is cobalt.

Suitable specific substrates are described in the Table I below.

TABLE 1

| Comp. No./Property | Compositions (Weight Percent) and Properties of Cemented Tungsten Carbide-Based Compositions | | | | | | |
|---|---|---|---|---|---|---|---|
| | No. 1 | No. 2 | No. 3 | No. 4 | No. 5 | No. 6 | No. 7 |
| Ta | 0 | 2.9–3.6 | 3.2–3.8 | 1.2–2.5 | 0–0.1 | 5.0–6.0 | 4.2–5.0 |
| Nb | 0 | 0–0.3 | 1.2–1.8 | 0.3–0.6 | 0–0.1 | 0–0.4 | 0.6–1.4 |
| Ti | 0 | 0–0.5 | 1.7–2.3 | 0–0.4 | 0–0.1 | 1.7–2.3 | 3.2–3.8 |

TABLE 1-continued

Compositions (Weight Percent) and Properties of Cemented Tungsten Carbide-Based Compositions

| Comp. No./ Property | No. 1 | No. 2 | No. 3 | No. 4 | No. 5 | No. 6 | No. 7 |
|---|---|---|---|---|---|---|---|
| Cr | 0.3–0.5 | 0 | 0 | 0 | 0 | 0 | 0 |
| Co | 5.7–6.3 | 5.7–6.4 | 6.2–6.4 | 11–12 | 9.4–10.2 | 5.7–6.3 | 5.8–6.2 |
| WC | Balance | Balance | Balance | Balance | Balance | Balance | Balance |
| Hardness (Rockwell A) | 92.6–93.4 | 91.6–92.2 | 90.7–91.5 | 89.4–90.2 | 90.5–91.1 | 91.5–92.1 | 91.8–92.4 |
| Magnetic Coercive Force (HC) Oersted | 250–320 | 190–250 | 125–155 | 145–185 | 180–220 | 155–205 | 155–205 |
| Magnetic Saturation (Percent)* | 83–95 | 80–92 | 88–100 | 81–91 | 80–90 | 88–100 | 88–100 |
| Grain Size (micrometers) | 1–5 | 1–6 | 1–7 | 1–6 | 1–8 | 1–6 | 1–6 |

*One hundred percent (100%) magnetic saturation equals 160 gauss cubic centimeter per gram cobalt (gauss-cm$^3$/gm) or 202 micro Tesla cubic meter per kilogram cobalt ($\mu$T-m$^3$/kg).

Composition No. 7 presents a substrate with binder (cobalt) enrichment near the surface of the substrate. Reissue U.S. Pat. No. 34,180 to Nemeth et al. for PREFERENTIALLY BINDER ENRICHED CEMENTED CARBIDE BODIES AND METHOD OF MANUFACTURE (assigned to the assignee of the present patent application) discloses methods of producing a substrate with binder enrichment near the surface of the substrate.

Applicant submits that the above cutting tools would have superior properties in the milling of ductile iron alloys. The ability of the cutting tool to withstand the mechanical stresses and the thermal stresses makes it an ideal candidate for such an application. It is expected that Composition No. 5 along with any one of the coating schemes of the invention will provide excellent results in the milling of ductile iron at lower speeds such as, for example, speeds that are equal to or less than about 1.78 surface meters per second (about 350 surface feet per minute). It is expected that Composition No. 2 along with any one of the coating schemes of the invention will provide excellent results in the high speed milling of ductile iron at speeds of between about 3.30 surface meters per second (about 650 surface feet per minute) and about 4.06 surface meters per second (about 800 surface feet per minute).

All patents and other documents identified in this application are hereby incorporated by reference herein.

Other embodiments of the invention will be apparent to those skilled in the art from a consideration of the specification or practice of the invention disclosed herein. It is intended that the specification and examples be considered as illustrative only, with the true scope and spirit of the invention being indicated by the following claims.

What is claimed is:

1. A coated cutting tool for the milling of ductile iron, the cutting tool comprising:

a rake face and a flank face, a cutting edge at the a juncture of the rake face and the flank face, and the cutting tool having a coating and a substrate;

the substrate comprising a tungsten carbide based cemented carbide having a bulk composition of no more than 7 weight percent tantalum, no more than 3 weight percent niobium, no more than 5 weight percent titanium, no more than 1 weight percent chromium, between about 5 and about 13 weight percent cobalt, and the balance tungsten carbide; and the coating comprising an innermost coating scheme including at least one layer adjacent to the substrate, and the coating further including an outermost layer comprising titanium carbide applied by chemical vapor deposition layer.

2. The coated cutting tool of claim 1 wherein the chemical vapor deposition occurs at a temperature between about 900° C. and about 1050° C.

3. The coated cutting tool of claim 1 wherein the chemical vapor deposition occurs at a temperature of between about 300° C. and about 850° C.

4. The coated cutting tool of claim 1 wherein the innermost coating scheme comprises a single layer of titanium carbonitride applied by chemical vapor deposition at a temperature between about 900° C. and about 1050° C., and the CVD layer of titanium carbide is adjacent to the CVD layer of titanium carbonitride.

5. The coated cutting tool of claim 1 wherein the innermost coating scheme comprises a single layer of titanium carbonitride applied by chemical vapor deposition at a temperature of between about 300° C. and about 850° C., and the CVD layer of titanium carbide is adjacent to the CVD layer of titanium carbonitride.

6. The coated cutting tool of claim 5 wherein the CVD coating scheme is applied at a pressure of between about 700 mm Hg and about 800 mm Hg.

7. The coated cutting tool of claim 1 wherein the innermost coating scheme comprises a layer of titanium nitride applied by physical vapor deposition directly to the substrate, and a layer of titanium carbonitride applied by physical vapor deposition to the PVD layer of titanium nitride, and the CVD layer of titanium carbide is adjacent to the PVD layer of titanium carbonitride.

8. The coated cutting tool of claim 1 wherein the innermost coating scheme comprises a layer of titanium aluminum nitride applied by physical vapor deposition, and the CVD layer of titanium carbide is adjacent to the PVD layer of titanium aluminum nitride.

9. The coated cutting tool of claim 1 wherein the innermost coating scheme has a thickness of between about 2 micrometers and about 4 micrometers.

10. The coated cutting tool of claim 1 wherein the outermost CVD layer of titanium carbide has a thickness of about 1.5 micrometers.

11. The coated cutting tool of claim 1 wherein the substrate has a hardness of between about 89 and about 94

Rockwell A, a magnetic coercive force of between about 125 and about 320 oersted, and a magnetic saturation value between about 80 percent and about 100 percent.

12. The coated cutting tool of claim 1 wherein the composition of the bulk composition comprises: no more than 0.1 weight percent tantalum, no more than 0.1 weight percent niobium, no more than 0.1 weight percent titanium, between about 0.3 and about 0.5 weight percent chromium, between about 5.7 and about 6.3 weight percent cobalt, and the balance tungsten carbide, and wherein the tungsten carbide has an average grain size of 1–5 micrometers.

13. The coated cutting tool of claim 1 wherein the composition of the bulk composition comprises: between about 2.9 and about 3.6 weight percent tantalum, no more than about 0.3 weight percent niobium, no more than about 0.5 weight percent titanium, between about 5.7 and about 6.4 weight percent cobalt, and the balance tungsten carbide, and wherein the tungsten carbide has an average grain size of 1–6 micrometers.

14. The coated cutting tool of claim 1 wherein the composition of the bulk composition comprises: between about 3.2 and about 3.8 weight percent tantalum, between about 1.2 and about 1.8 weight percent niobium, between about 1.7 and about 2.3 weight percent titanium, between about 6.2 and about 6.4 weight percent cobalt, and the balance tungsten carbide, and wherein the tungsten carbide has an average grain size of 1–7 micrometers.

15. The coated cutting tool of claim 1 wherein the composition of the bulk composition comprises: between about 1.4 and about 2.3 weight percent tantalum, between about 0.3 and about 0.6 weight percent niobium, no more than about 0.5 weight percent titanium, between about 11.0 and about 12.0 weight percent cobalt, and the balance tungsten carbide, and wherein the tungsten carbide has an average grain size of 1–6 micrometers.

16. The coated cutting tool of claim 1 wherein the composition of the bulk composition comprises: no more than 0.1 weight percent tantalum, no more than 0.1 weight percent niobium, no more than about 0.1 weight percent titanium, between about 9.45 and about 10.15 weight percent cobalt, and the balance tungsten carbide.

17. The coated cutting tool of claim 1 wherein the composition of the bulk composition comprises: between 5.0 and 6.0 weight percent tantalum, no more than 0.4 weight percent niobium, between 1.7 and 2.3 weight percent titanium, between about 5.7 and about 6.3 weight percent cobalt, and the balance tungsten carbide.

18. The coated cutting tool of claim 1 wherein the composition of the bulk composition comprises: between 4.2 and 5.0 weight tantalum, between 0.6 and 1.4 weight percent niobium, between 3.2 and about 3.8 weight percent titanium, between about 5.8 and about 6.2 weight percent cobalt, and the balance tungsten carbide.

19. The coated cutting tool of claim 18 comprising a layer of cobalt enrichment near a peripheral surface of the substrate.

20. A coated cutting tool for the milling of ductile iron, the cutting tool comprising:
a rake face and a flank face, a cutting edge at the a juncture of the rake face and the flank face, and the cutting tool having a coating and a substrate;
the substrate comprising a tungsten carbide based cemented carbide having a bulk composition of no more than 7 weight percent tantalum, no more than 3 weight percent niobium, no more than 5 weight percent titanium, no more than 1 weight percent chromium, between about 5 and about 13 weight percent cobalt, and the balance tungsten carbide; and the coating comprising an innermost coating scheme including at least one layer adjacent to the substrate, and the coating further including an outermost layer consisting essentially of titanium carbide applied by chemical vapor deposition.

21. The coated cutting tool of claim 20 wherein the innermost coating scheme consists essentially of a single layer of titanium carbonitride applied by chemical vapor deposition at a temperature between about 900° C. and about 1050° C., and the CVD layer of titanium carbide is adjacent to the CVD layer of titanium carbonitride.

22. The coated cutting tool of claim 20 wherein the innermost coating scheme consists essentially of a single layer of titanium carbonitride applied by chemical vapor deposition at a temperature of between about 300° C. and about 850° C., and the CVD layer of titanium carbide is adjacent to the CVD layer of titanium carbonitride.

23. The coated cutting tool of claim 22 wherein the CVD coating scheme is applied at a pressure of between about 700 mm Hg and about 800 mm Hg.

24. The coated cutting tool of claim 20 wherein the innermost coating scheme consist essentially of a layer of titanium nitride applied by physical vapor deposition directly to the substrate, and a layer of titanium carbonitride applied by physical vapor deposition to the PVD layer of titanium nitride, and the CVD layer of titanium carbide is adjacent to the PVD layer of titanium carbonitride.

25. The coated cutting tool of claim 20 wherein the innermost coating scheme comprises a layer of titanium aluminum nitride applied by physical vapor deposition, and the CVD layer of titanium carbide is adjacent to the PVD layer of titanium aluminum nitride.

26. The coated cutting tool of claim 20 wherein the innermost coating scheme has a thickness of between about 2 micrometers and about 4 micrometers.

27. The coated cutting tool of claim 20 wherein the outermost CVD layer of titanium carbide has a thickness of about 1.5 micrometers.

28. The coated cutting tool of claim 20 wherein the substrate has a hardness of between about 89 and about 94 Rockwell A, a magnetic coercive force of between about 125 and about 320 oersted, and a magnetic saturation value between about 80 percent and about 100 percent.

29. The coated cutting tool of claim 20 wherein the composition of the bulk composition comprises: no more than 0.1 weight percent tantalum, no more than 0.1 weight percent niobium, no more than 0.1 weight percent titanium, between about 0.3 and about 0.5 weight percent chromium, between about 5.7 and about 6.3 weight percent cobalt, and the balance tungsten carbide, and wherein the tungsten carbide has an average grain size of 1–5 micrometers.

30. The coated cutting tool of claim 20 wherein the composition of the bulk composition comprises: between about 2.9 and about 3.6 weight percent tantalum, no more than about 0.3 weight percent niobium, no more than about 0.5 weight percent titanium, between about 5.7 and about 6.4 weight percent cobalt, and the balance tungsten carbide, and wherein the tungsten carbide has an average grain size of 1–6 micrometers.

31. The coated cutting tool of claim 20 wherein the composition of the bulk composition comprises: between about 3.2 and about 3.8 weight percent tantalum, between about 1.2 and about 1.8 weight percent niobium, between about 1.7 and about 2.3 weight percent titanium, between about 6.2 and about 6.4 weight percent cobalt, and the balance tungsten carbide, and wherein the tungsten carbide has an average grain size of 1–7 micrometers.

32. The coated cutting tool of claim 20 wherein the composition of the bulk composition comprises: between about 1.4 and about 2.3 weight percent tantalum, between about 0.3 and about 0.6 weight percent niobium, no more than about 0.5 weight percent titanium, between about 11.0 and about 12.0 weight percent cobalt, and the balance tungsten carbide, and wherein the tungsten carbide has an average grain size of 1–6 micrometers.

33. The coated cutting tool of claim 20 wherein the composition of the bulk composition comprises: no more than 0.1 weight percent tantalum, no more than 0.1 weight percent niobium, no more than about 0.1 weight percent titanium, between about 9.45 and about 10.15 weight percent cobalt, and the balance tungsten carbide.

34. The coated cutting tool of claim 20 wherein the composition of the bulk composition comprises: between 5.0 and 6.0 weight percent tantalum, no more than 0.4 weight percent niobium, between 1.7 and 2.3 weight percent titanium, between about 5.7 and about 6.3 weight percent cobalt, and the balance tungsten carbide.

35. The coated cutting tool of claim 20 wherein the composition of the bulk composition comprises: between 4.2 and 5.0 weight tantalum, between 0.6 and 1.4 weight percent niobium, between 3.2 and 3.8 weight percent titanium, between about 5.8 and about 6.2 weight percent cobalt, and the balance tungsten carbide.

36. The coated cutting tool of claim 35 comprising a layer of cobalt enrichment near a peripheral surface of the substrate.

37. A method of making a coated cutting tool comprising the steps of:
providing a substrate that is a tungsten carbide based cemented carbide having a bulk composition of no more than 7 weight percent tantalum, no more than 3 weight percent niobium, no more than 5 weight percent titanium, no more than 1 weight percent chromium, between about 5 and about 13 weight percent cobalt, and the balance tungsten carbide;
applying an innermost coating scheme to the substrate; and
applying by chemical vapor deposition an outermost layer of titanium carbide to the inner coating scheme.

38. The method of making a coated cutting tool of claim 37 wherein the chemical vapor deposition of titanium carbide occurs at a temperature of between 900° C. and 1050° C.

39. The method of making a coated cutting tool of claim 37 wherein the chemical vapor deposition of titanium carbide occurs at a temperature of between about 300° C. and about 850° C.

40. The method of making a coated cutting tool of claim 37 wherein the step of applying the innermost coating scheme comprises applying a single layer of titanium carbonitride by chemical vapor deposition at a temperature of between about 900° C. and 1050° C.

41. The method of making a coated cutting tool of claim 37 wherein the step of applying the innermost coating scheme comprises applying a single layer of titanium carbonitride by chemical vapor deposition at a temperature of between about 300° C. and about 850° C.

42. The method of making a coated cutting tool of claim 37 wherein the step of applying the innermost coating scheme comprises applying a layer of titanium nitride by physical vapor deposition directly to the substrate and applying a layer of titanium carbonitride by physical vapor deposition to the PVD layer of titanium nitride.

43. The method of making a coated cutting tool of claim 37 wherein the step of applying the innermost coating scheme comprises applying a layer of titanium aluminum nitride by physical vapor deposition.

44. The method of making a coated cutting tool of claim 37 wherein the innermost coating scheme has an overall thickness of between about 2 micrometers and about 4 micrometers.

45. The method of making a coated cutting tool of claim 37 wherein the CVD titanium carbide outer layer has a thickness of about 1.5 micrometers.

46. A method of milling ductile iron comprising the steps of: milling the ductile iron at a predetermined speed with a cemented carbide cutting tool having a substrate and a coating; wherein the substrate comprises a tungsten carbide based cemented carbide having a bulk composition of no more than 7 weight percent tantalum, no more than 3 weight percent niobium, no more than 5 weight percent titanium, no more than 1 weight percent chromium, between about 5 and about 13 weight percent cobalt, and the balance tungsten carbide; and the coating comprises an innermost coating scheme including at least one layer adjacent to the substrate, and the coating further including an outermost coating comprising a layer of titanium carbide applied by chemical vapor deposition.

* * * * *